(12) United States Patent
Kwak et al.

(10) Patent No.: US 7,180,927 B2
(45) Date of Patent: Feb. 20, 2007

(54) SEMICONDUCTOR LASER DIODE AND SEMICONDUCTOR LASER DIODE ASSEMBLY CONTAINING THE SAME

(75) Inventors: Joon-seop Kwak, Kyungki-do (KR); Su-hee Chae, Kyungki-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 354 days.

(21) Appl. No.: 10/732,240

(22) Filed: Dec. 11, 2003

(65) Prior Publication Data

US 2004/0174918 A1    Sep. 9, 2004

(30) Foreign Application Priority Data

Mar. 8, 2003    (KR)    .................. 10-2003-0014614

(51) Int. Cl.
*H01S 5/00*    (2006.01)
(52) U.S. Cl. ................... 372/50.1; 372/43.01
(58) Field of Classification Search ............. 372/50.1, 372/43.01, 50.01
See application file for complete search history.

(56) References Cited

U.S. PATENT DOCUMENTS

| | | | |
|---|---|---|---|
| 5,093,697 A | | 3/1992 | Satoh |
| 6,171,876 B1 * | | 1/2001 | Yuang et al. .................. 438/22 |
| 6,360,048 B1 | | 3/2002 | Yamada |
| 6,503,770 B1 | | 1/2003 | Ho et al. |
| 6,757,313 B1 * | | 6/2004 | Connolly et al. ...... 372/46.015 |
| 6,925,101 B2 * | | 8/2005 | Matsumura .............. 372/46.01 |
| 2002/0028390 A1 | | 3/2002 | Mazed |
| 2002/0064196 A1 * | | 5/2002 | Shiozawa et al. ............. 372/45 |
| 2003/0042476 A1 | | 3/2003 | Nakahara et al. |
| 2004/0218648 A1 * | | 11/2004 | Sung et al. .................... 372/46 |
| 2005/0030994 A1 * | | 2/2005 | Kozaki et al. ................. 372/43 |
| 2005/0190416 A1 * | | 9/2005 | Yoneda ....................... 359/27 |
| 2005/0224783 A1 * | | 10/2005 | Matsuyama et al. .......... 257/14 |

OTHER PUBLICATIONS

European Search Report.

* cited by examiner

*Primary Examiner*—Minsun Oh Harvey
*Assistant Examiner*—Delma R. Flores-Ruiz
(74) *Attorney, Agent, or Firm*—Buchanan Ingersoll & Rooney P.C.

(57) ABSTRACT

Provided is a semiconductor laser diode. The semiconductor laser diode includes a first material layer, an active layer, and a second material layer, characterized in that the semiconductor laser diode includes: a ridge waveguide, which is formed in a ridge shape over the second material layer to define a channel defined so that a top material layer of the second material layer is limitedly exposed, and in which a second electrode layer which is in contact with the top material layer of the second material layer via the channel is formed; and a first protrusion, which is positioned at one side of the ridge waveguide and has not less height than that of the ridge waveguide.

12 Claims, 9 Drawing Sheets

SEMICONDUCTOR LASER DIODE AND SEMICONDUCTOR LASER DIODE ASSEMBLY CONTAINING THE SAME

BACKGROUND OF THE INVENTION

This application claims the priority of Korean Patent Application No. 2003-14614, filed on Mar. 8, 2003, in the Korean Intellectual Property Office, the disclosure of which is incorporated herein in its entirety by reference.

1. Field of the Invention

The present invention relates to a semiconductor laser diode and more particularly, to a semiconductor laser diode having a ridge waveguide.

2. Description of the Related Art

As high density information recording is increasingly in demand, the need for a visible light semiconductor laser diode is increasing. Therefore, semiconductor laser diodes made of various compounds capable of emitting a visible light laser are being developed. In particular, much attention has been paid to a group III-V nitride semiconductor laser diode because its optical transition is a direct transition type that induces high frequency laser emission and because it emits a blue light laser.

FIG. 1 shows a perspective view of a conventional GaN-based, group III-V nitride semiconductor laser diode having n-type and p-type electrodes, which are formed on the same side, and a ridge waveguide.

Referring to FIG. 1, an n-type material layer 20, a light emitting active layer 30, and a p-type material layer 40 are sequentially formed on a sapphire substrate 10. The upper surface of the p-type material layer 40 is formed with a ridge waveguide 70. The ridge waveguide 70 is slightly protruded from the upper surface of the p-type material layer 40. The ridge waveguide 70 comprises a channel 71 formed so that the p-type material layer 40 is exposed in a narrow stripe-type configuration, and a p-type electrode layer 50, which is in contact with the p-type material layer 40 via the channel 71. Strictly speaking, a reference numeral 2 is not the p-type material layer 40 but is a current restricting layer formed for defining the channel 71.

An n-type electrode layer 60 serves to feed an electric current into a bottom material layer 21 of the n-type material layer 20 and is formed on an exposed surface 22 of the bottom material layer 21 of the n-type material layer 20.

In this structure, the upper surface of the p-type electrode layer 50, that is, the upper surface 72 of the ridge waveguide 70, and the upper surface of the n-type electrode layer 60 are separated by a step height, h1.

Generally, a temperature has an effect on a critical current and laser mode stability for laser emission of semiconductor laser diodes. As a temperature increases, both of the characteristics are lowered. Therefore, there is a need to remove heat generated in an active layer during laser emission to thereby prevent overheating of laser diodes. In the structure of the aforementioned conventional GaN-based, group III-V semiconductor laser diode, most heat is discharged only through a ridge because of very low thermal conductivity of a substrate (for a sapphire substrate, about 0.5 W/cmK). However, because heat discharge through a ridge occurs limitedly, it is difficult to carry out efficient heat discharge. Therefore, lowering of characteristics of semiconductor devices by overheating of laser diodes is not efficiently prevented.

In this regard, a flip-chip bonding technology shown in FIG. 2 can be applied to the structure of a conventional semiconductor laser diode shown in FIG. 1 to discharge heat generated in an active layer.

Referring to FIG. 2, a reference numeral 80 indicates a conventional GaN-based, group III-V semiconductor laser diode. A reference numeral 90 indicates a submount as a heat discharge structure, a reference numeral 91 a substrate, and reference numerals 92a and 92b first and second metal layers, respectively. Reference numerals 93a and 93b indicate first and second solder layers, which are respectively fused to an n-type electrode layer 60 and a p-type electrode layer 50 of the semiconductor laser diode 80.

By bonding the semiconductor laser diode to the submount, a separately prepared heat discharge structure, heat discharge efficiency can be increased.

However, as shown in FIG. 2, the first solder layer 93a is thicker than the second solder layer 93b by the height of h1 in order to compensate for the step height, h1 between the p-type electrode 50 and the n-type electrode 60. Due to such a thickness difference, the first and second solder layers 93a and 93b may not concurrently be molten.

The first and second solder layers 93a and 93b are generally made of a metal alloy, and thus, even if the chemical composition ratios of the first and second solder layers 93a and 93b slightly differ from each other, there is a large difference between their melting temperatures. In a case wherein the first and second solder layers 93a and 93b differ in thickness in a method of manufacturing the submount, the first and second solder layers 93a and 93b must be formed under separate two processes, not under a single process. As a result, there exists a likelihood for the first and second solder layers 93a and 93b to have different chemical composition ratios.

The ridge waveguide 70 is protruded from the p-type material layer 40, and although exaggerated in FIG. 2, has a width W1 of no more than several micrometers. Therefore, when the semiconductor laser diode 80 is bonded to the submount 90, a thermal stress may be concentrated on the ridge waveguide 70. In addition, when the first and second solder layers 93a and 93b are not concurrently fused as mentioned above, the submount 90 may be inclined to one side. In this case, a mechanical stress may be concentrated on the narrow ridge waveguide 70.

Stresses concentrated on the ridge waveguide 70 may affect light emission in the active layer 30 below the ridge waveguide 70.

FIG. 3 shows an image plane photograph of laser light emission taken along the longitudinal direction A of the stripe-like ridge waveguide 70. As shown in FIG. 3, light is emitted unevenly and discontinuously along the longitudinal direction A of the ridge waveguide 70.

SUMMARY OF THE INVENTION

The present invention has been made in view of the above problems. The present invention provides a semiconductor laser diode with an improved structure capable of dispersing a stress concentrated on a ridge waveguide when flip-chip bonded to a submount.

According to an aspect of the present invention, there is provided a semiconductor laser diode comprising first and second material layers which are multi-material layers, and an active layer interposed between the first and second material layers to emit light, characterized in that the semiconductor laser diode comprises a ridge waveguide, which is formed in a ridge shape over the second material layer to define a channel so that a top material layer of the second material layer is limitedly exposed, and in which a second electrode layer which is in contact with the top material layer of the second material layer via the channel is formed; and a first protrusion, which is positioned at one side of the ridge waveguide and has not less height than that of the ridge waveguide.

According to specific embodiments of the present invention, the first protrusion may have a width wider than the width of the ridge waveguide.

The semiconductor laser diode may further comprise a second protrusion having not less height than that of the ridge waveguide at the other side of the ridge waveguide. The second protrusion may have a width wider than the width of the ridge waveguide and may have the same height as the first protrusion. When the first and second protrusions differ in height, the height difference may be 0.5 µm or less.

The second protrusion may be separated from the ridge waveguide by a valley portion, which is etched to expose a bottom material layer of the first material layer, and a top layer of the second protrusion may be a first electrode layer electrically connected to the bottom material layer of the first material layer.

The other side of the ridge waveguide may be formed with an exposed surface of the bottom material layer of the first material layer and a first electrode layer having not less height than that of the ridge waveguide may be formed on the exposed surface. The first electrode layer serves the same function as the second protrusion. The first protrusion and the first electrode layer may have the same height. The first electrode layer may have a width wider than the width of the ridge waveguide. When the first protrusion and the first electrode layer differ in height, the height difference may be 0.5 µm or less.

According to another aspect of the present invention, there is provided a semiconductor laser diode assembly comprising a semiconductor laser diode comprising first and second material layers which are multi-material layers, and an active layer interposed between the first and second material layers to emit light; and a submount flip-chip bonded to the semiconductor laser diode, wherein the semiconductor laser diode comprises a ridge waveguide, which is formed in a ridge shape over the second material layer to define a channel so that a top material layer of the second material layer is limitedly exposed, and in which a second electrode layer which is in contact with the top material layer of the second material layer via the channel is formed; a first protrusion, which is positioned at one side of the ridge waveguide and has not less height than that of the ridge waveguide; and a second protrusion, which is positioned at the other side of the ridge waveguide and has not less height than that of the ridge waveguide and of which a top material layer is a first electrode layer electrically connected to a bottom material layer of the first material layer, and wherein the submount comprises a substrate; a first solder layer bonded to the first protrusion and the ridge waveguide; and a second solder layer bonded to the second protrusion, the first and second solder layers being formed at a surface of the substrate and having substantially the same thickness.

According to yet another aspect of the present invention, there is provided a semiconductor laser diode assembly comprising a semiconductor laser diode comprising first and second material layers which are multi-material layers, and an active layer interposed between the first and second material layers to emit light; and a submount flip-chip bonded to the semiconductor laser diode, wherein the semiconductor laser diode comprises a ridge waveguide, which is formed in a ridge shape over the second material layer to define a channel so that a top material layer of the second material layer is limitedly exposed, and in which a second electrode layer which is in contact with the top material layer of the second material layer via the channel is formed; a first protrusion, which is positioned at one side of the ridge waveguide and has not less height than that of the ridge waveguide; and a first electrode layer, which is positioned at the other side of the ridge waveguide, has not less height than that of the ridge waveguide, and electrically connected to a bottom material layer of the first material layer, and wherein the submount comprises a substrate; a first solder layer bonded to the first protrusion and the ridge waveguide; and a second solder layer bonded to the first electrode layer, the first and second solder layers being formed at a surface of the substrate and having substantially the same thickness.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, preferred embodiments of the present invention will be described in more detail with reference to the accompanying drawings.

Figure 4:
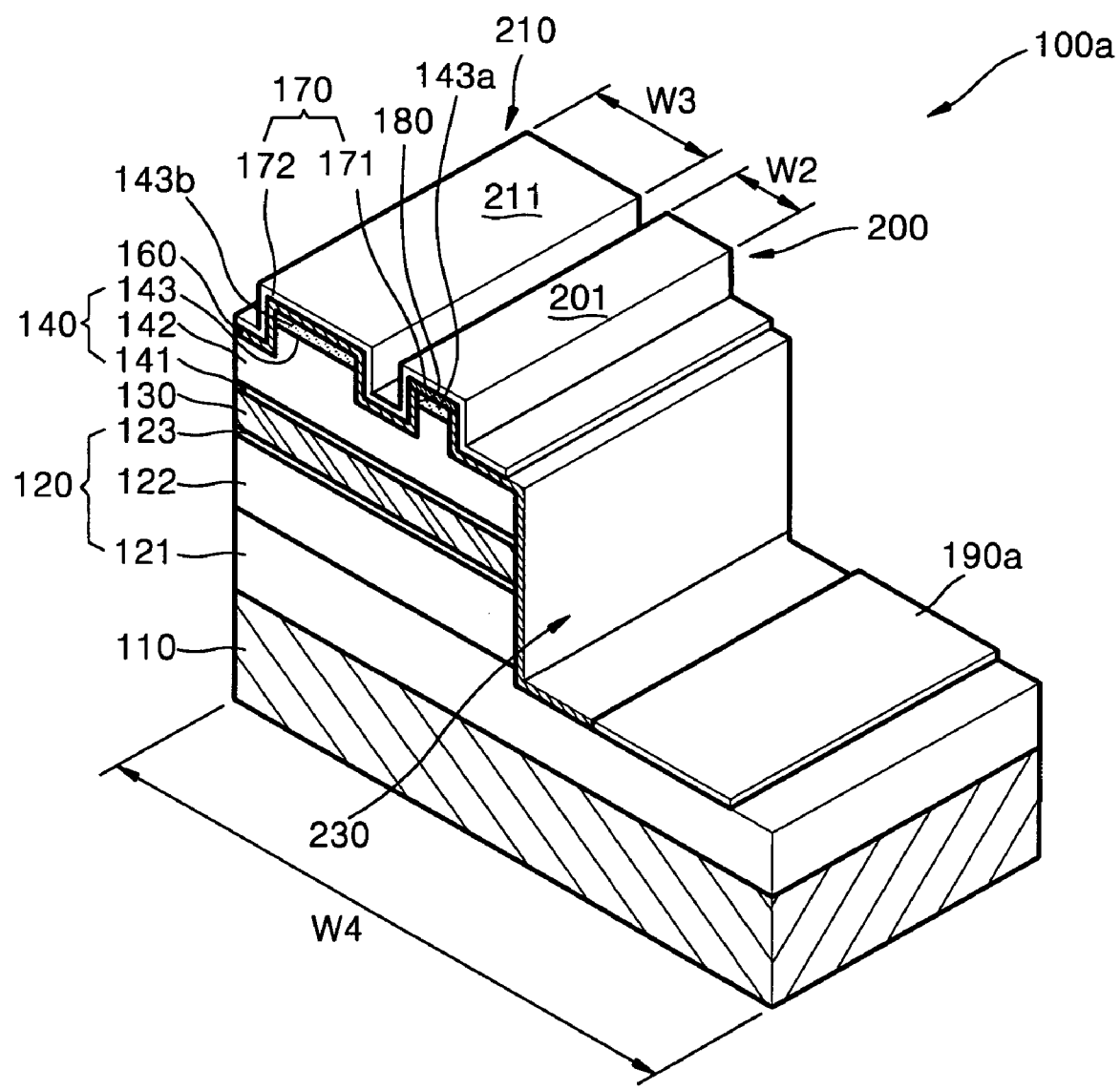
FIG. 4 is a perspective view of a semiconductor laser diode according to an embodiment of the present invention.

FIG. 4 is a perspective view of a semiconductor laser diode according to an embodiment of the present invention. The illustration of the semiconductor laser diode of FIG. 4 has been exaggerated to show characteristics of the semiconductor laser diode according to the present invention more clearly. The semiconductor laser diode according to this embodiment of the present invention is a GaN-based, group III-V nitride semiconductor laser diode.

Referring to FIG. 4, the semiconductor laser diode 100a comprises a substrate 110, a first material layer 120, an active layer 130, and a second material layer 140 that are sequentially mounted on the substrate 110.

The substrate 110 may be a GaN or SiC-based, group III-V semiconductor layer substrate or a high resistance substrate such as a sapphire substrate.

The active layer 130 is a material layer of emitting light by carrier recombination of an electron and a hole. Preferably, the active layer 130 is a GaN-based, group III-V nitride semiconductor layer having a multi quantum well (MQW) and more preferably, an $In_xAl_yGa_{1-x-y}$ layer where $0 \leq x \leq 1$, $0 \leq y \leq 1$, and $x+y \leq 1$. The active layer 130 may also be a GaN-based, group III-V nitride semiconductor layer containing a predetermined ratio of Indium (In), for example, an InGaN layer.

The first material layer 120 comprises a buffer layer 121, a first cladding layer 122, and a first waveguide layer 123 that are sequentially mounted on the upper surface of the substrate 110. The second material layer 140 comprises a second waveguide layer 141, a second cladding layer 142, and a cap layer 143 that are sequentially mounted on the upper surface of the active layer 130. A bottom layer of the first material layer 120 is the buffer layer 121 and a top layer of the second material layer 140 is the cap layer 143.

The buffer layer 121 is an n-type material layer made of a GaN-based, group III-V nitride semiconductor or an undoped material layer. Preferably, the buffer layer 121 is an n-GaN layer.

The cap layer 143 is a GaN-based, group III-V nitride semiconductor layer, preferably a p-type conductive impurity-doped direct transition layer, and more preferably a p-GaN layer. In addition, the cap layer 143 may be a GaN layer, an AlGaN layer or InGaN layer containing a predetermined ratio of Al or In, like the buffer layer 121.

The first and second waveguide layers 123 and 141 are GaN-based, group III-V nitride semiconductor layers, and preferably, an n-GaN layer and a p-GaN layer, respectively. The first and second waveguide layers 123 and 141 have a reflective index lower than the active layer 130 and higher than the first cladding layer 122 and the second cladding layer 142 as will be described later.

The first cladding layer 122 is an n-AlGaN/GaN layer and the second cladding layer 142 is the same material layer as the first cladding layer 122 except that a p-type material is doped.

In order to induce laser emission in the active layer 130, the semiconductor laser diode 100a comprises an n-type electrode layer 190a and a p-type electrode layer 170, which are electrically connected to the buffer layer 121 and the cap layer 143, respectively. A reference numeral 160 indicates a current restricting layer, which defines a channel 180 as a passage for limited contact between the p-type electrode layer 170 and the cap layer 143.

As shown in the left part of FIG. 4, the cap layer 143 is divided into first and second regions 143a and 143b. The cap layer 143 and the partially exposed second cladding layer 142 are covered with the current restricting layer 160. The current restricting layer 160 covering the first region 143a of the cap layer 143 is removed to expose the cap layer 143. As a result, the channel 180 is formed and the p-type electrode layer 170 and the cap layer 143 are limitedly in contact with each other through the channel 180. The channel 180 is filled with a contact layer 171 and a bonding metal layer 172 is formed on the upper surfaces of the contact layer 171 and the current restricting layer 160. Hereinafter, the p-type electrode layer 170 is designated a layer containing the contact layer 171 and the bonding metal layer 172.

As mentioned above, when formation of the p-type electrode layer 170 is completed, a ridge waveguide 200 is formed at the first region 143a of the cap layer 143 and a first protrusion 210 is formed at the second region 143b of the cap layer 143.

Preferably, the first protrusion 210 is formed with a width wider than the width W2 of the ridge waveguide 200. Although slightly exaggerated in FIG. 4, the ridge waveguide 200 has a width W2 of no more than several micrometers. Generally, the width W4 of the semiconductor laser diode 100a is about 200 μm. The first protrusion 210 may be separated from one side of the ridge waveguide 200 by about 10 μm and be formed with a width W3 of about 50 to 100 μm. Preferably, the width W3 of the first protrusion 210 is formed to be wider than that W2 of the ridge waveguide 200, but is not limited to the aforementioned range.

Preferably, the upper surface 211 of the first protrusion 210 is formed to be at the same height as the upper surface 201 of the ridge waveguide 200 and more preferably, to be at a slightly higher height than the upper surface 201 of the ridge waveguide 200. For this, for example, the upper surface of the contact layer 171 is formed to be at a height equal to or slightly lower than the upper surface of the current restricting layer 160 on the second region 143b of the cap layer 143 and then the bonding metal layer 172 is formed to the same thickness. In addition, various approaches such as formation of the bonding metal layer 172 at the second region 143b of the cap layer 143 thicker than that at the first region 143a of the cap layer 143 may be considered.

The structural advantages of the semiconductor laser diode with the aforementioned structure will now be described.

Figure 5:
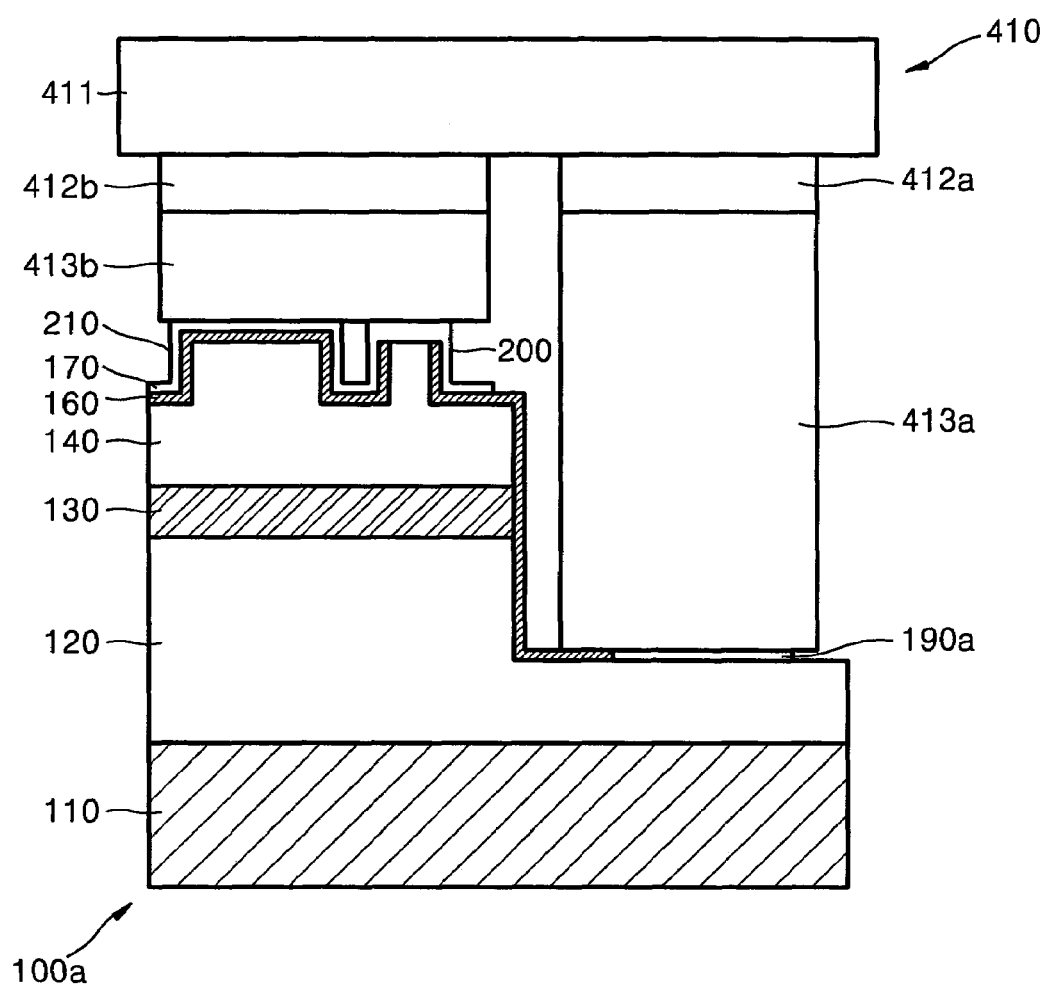
FIG. 5 is a sectional view of a flip-chip bonded structure of a submount and the semiconductor laser diode shown in FIG. 4 in a semiconductor laser diode assembly according to an embodiment of the present invention.

FIG. 5 is a sectional view of a flip-chip bonded structure of a submount and the semiconductor laser diode shown in FIG. 4 in a semiconductor laser diode assembly according to an embodiment of the present invention.

The submount 410 is a heat discharge structure for preventing overheating of the semiconductor laser diode 100a by heat generated in an active layer during laser emission.

Referring to FIG. 5, a reference numeral 411 indicates a substrate, reference numerals 412a and 412b indicate first and second metal layers, respectively, and reference numerals 413a and 413b indicate first and second solder layers, respectively.

Preferably, the substrate 411 is made of one of AlN, SiC, GaN, and an insulating material having a heat transfer coefficient corresponding to that of one of AlN, SiC, and GaN. The first and second metal layers 412a and 412b are made of an Au/Cr alloy or a metal material corresponding to the Au/Cr alloy. The first and second solder layers 413a and 413b are made of an Au/Sn alloy or a metal material corresponding to the Au/Sn alloy.

When the semiconductor laser diode 100a is bonded to the submount 410, the first solder layer 413a is fused to the n-type electrode layer 190a and the second solder layer 413b is fused to the p-type electrode layer 170. In the semiconductor laser diode 110a according to this embodiment of the present invention, the ridge waveguide 200 and the first protrusion 210 are positioned in the region of the p-type electrode layer 170, and thus, the second solder layer 413b is fused to the ridge waveguide 200 and the first protrusion 210.

Figure 1:
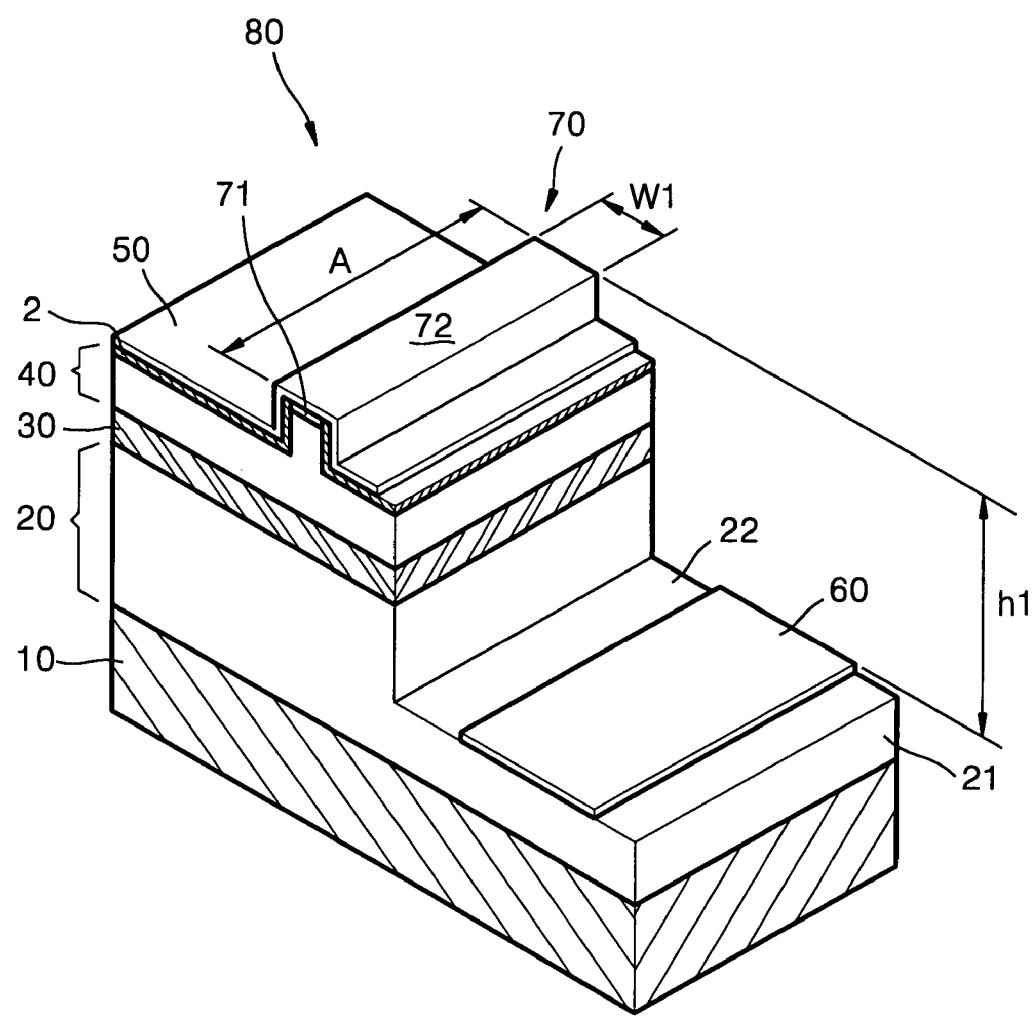
FIG. 1 is a perspective view of a conventional GaN-based, group III-V nitride semiconductor laser diode having n-type and p-type electrodes, which are formed on the same side.
Figure 3:
FIG. 3 is an image plane photograph of laser light emission taken along the longitudinal direction of a ridge waveguide in the semiconductor laser diode assembly shown in FIG. 2.

As mentioned above, in the case of the conventional semiconductor laser diode 80 shown in FIG. 1, only the ridge waveguide 70 with a width of no more than several micrometers is formed in the region of the p-type electrode layer 50. As a result, when the semiconductor laser diode 80 is bonded to the submount 90, thermal and mechanical stresses are concentrated on the protruded ridge waveguide 70, thereby causing uneven light emission as shown in FIG. 3.

In the case of the semiconductor laser diode 100a according to the embodiment of the present invention as shown in FIGS. 4 and 5, the first protrusion 210 with not less height than the ridge waveguide 200 is formed at one side of the ridge waveguide 200. Therefore, when the semiconductor laser diode 100a is bonded to the submount 410, the second solder layer 413b comes in contact with the first protrusion 210 and the ridge waveguide 200 at the same time or with first protrusion 210 first. Then, the second solder layer 413b is molten and spontaneously bonded to the ridge waveguide 200 and the first protrusion 210.

Because of this structural advantage in the semiconductor laser diode 100a, a thermal stress generated during flip-chip bonding is dispersed to the first protrusion 210 adjacent to the ridge waveguide 200. Therefore, uneven light emission due to concentration of a thermal stress on the ridge waveguide can be prevented. In addition, although the first and second solder layers 413a and 413b are not concurrently molten due to their thickness differences, a mechanical stress is dispersed to the first protrusion 210 with a width wider than the width of the ridge waveguide 200, and thus, the concentration of a mechanical stress on the ridge waveguide 200 can be prevented.

Figure 6:
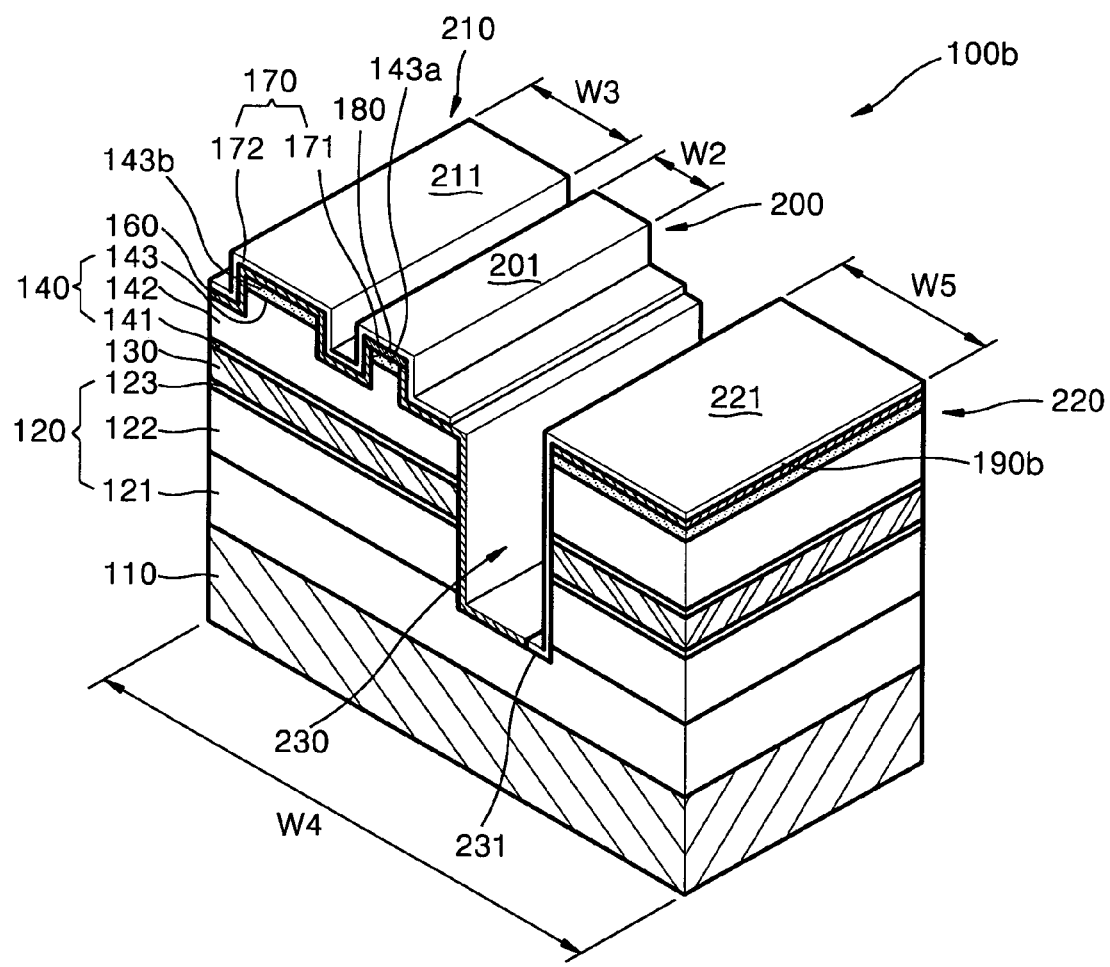
FIG. 6 is a perspective view of a semiconductor laser diode according to another embodiment of the present invention.

FIG. 6 is a perspective view of a semiconductor laser diode according to another embodiment of the present invention. The same reference numerals as used in FIG. 4 indicate the same constitutional elements.

The semiconductor laser diode 100b further comprises a second protrusion 220 at the other side of the ridge waveguide 200, that is, at the opposite side of the first protrusion 210.

Referring to FIG. 6, the second protrusion 220 is separated from the ridge waveguide 200 by a valley portion 230, which is etched to expose the buffer layer 121. The second protrusion 200 has a structure comprising the first material layer 120, the active layer 130, the second material layer 140, and the current restricting layer 160 that are sequentially mounted on the substrate 110, and an n-type electrode layer 190b mounted on the current restricting layer 160 to be electrically connected to the buffer layer 121. The n-type electrode layer 190b is a top layer of the second protrusion 220 and extends to the bottom surface 231 of the valley portion 230, to thereby be in contact with the buffer layer 121.

Preferably, the upper surface 221 of the second protrusion 220 is formed to be at the same height as the upper surface 201 of the ridge waveguide 200 and more preferably, at a slightly higher height than the upper surface 201 of the ridge waveguide 200. As shown in FIG. 6, preferably, the top layer of the second protrusion 220 is the n-type electrode layer 190b electrically connected to the buffer layer 121. In addition, the second protrusion 220 may has the same height as the first protrusion 210. If the first and second protrusions 210 and 220 differ in height, it is preferable to limit the height difference to 0.5 μm or less.

Figure 7:
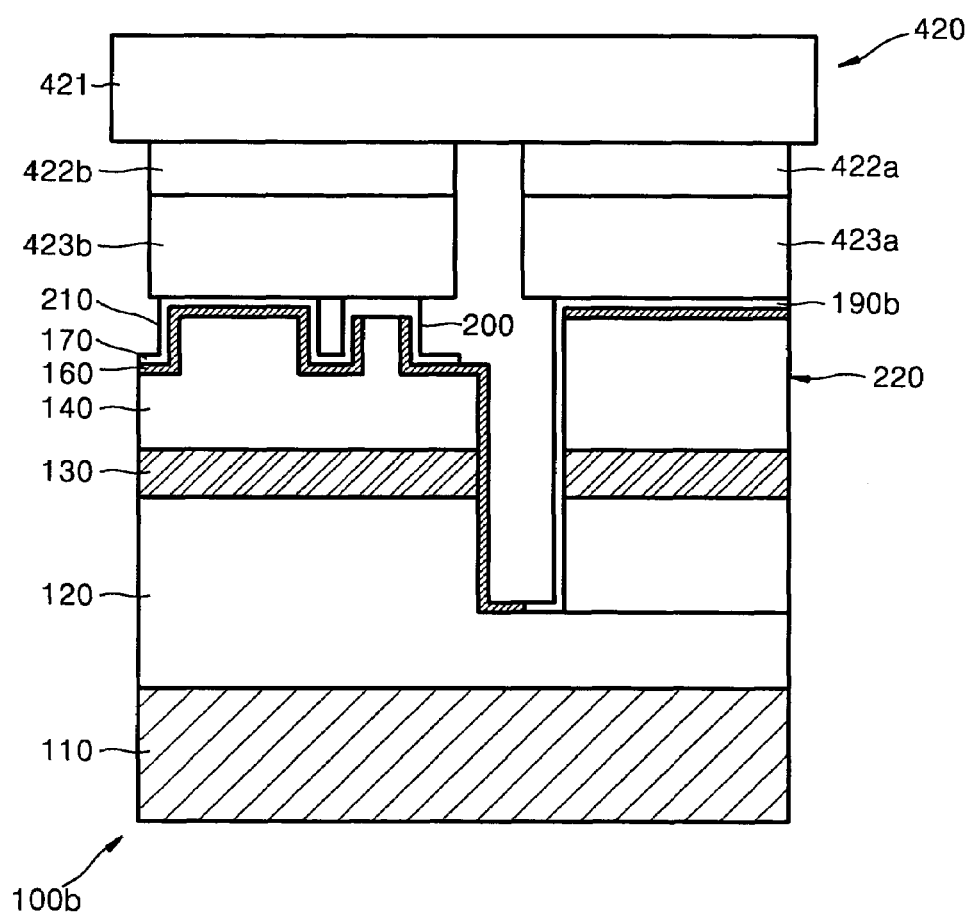
FIG. 7 is a sectional view of a flip-chip bonded structure of a submount and the semiconductor laser diode shown in FIG. 6 in a semiconductor laser diode assembly according to another embodiment of the present invention.

FIG. 7 is a sectional view of a flip-chip bonded structure of a submount and the semiconductor laser diode shown in FIG. 6 in a semiconductor laser diode assembly according to another embodiment of the present invention.

Figure 2:
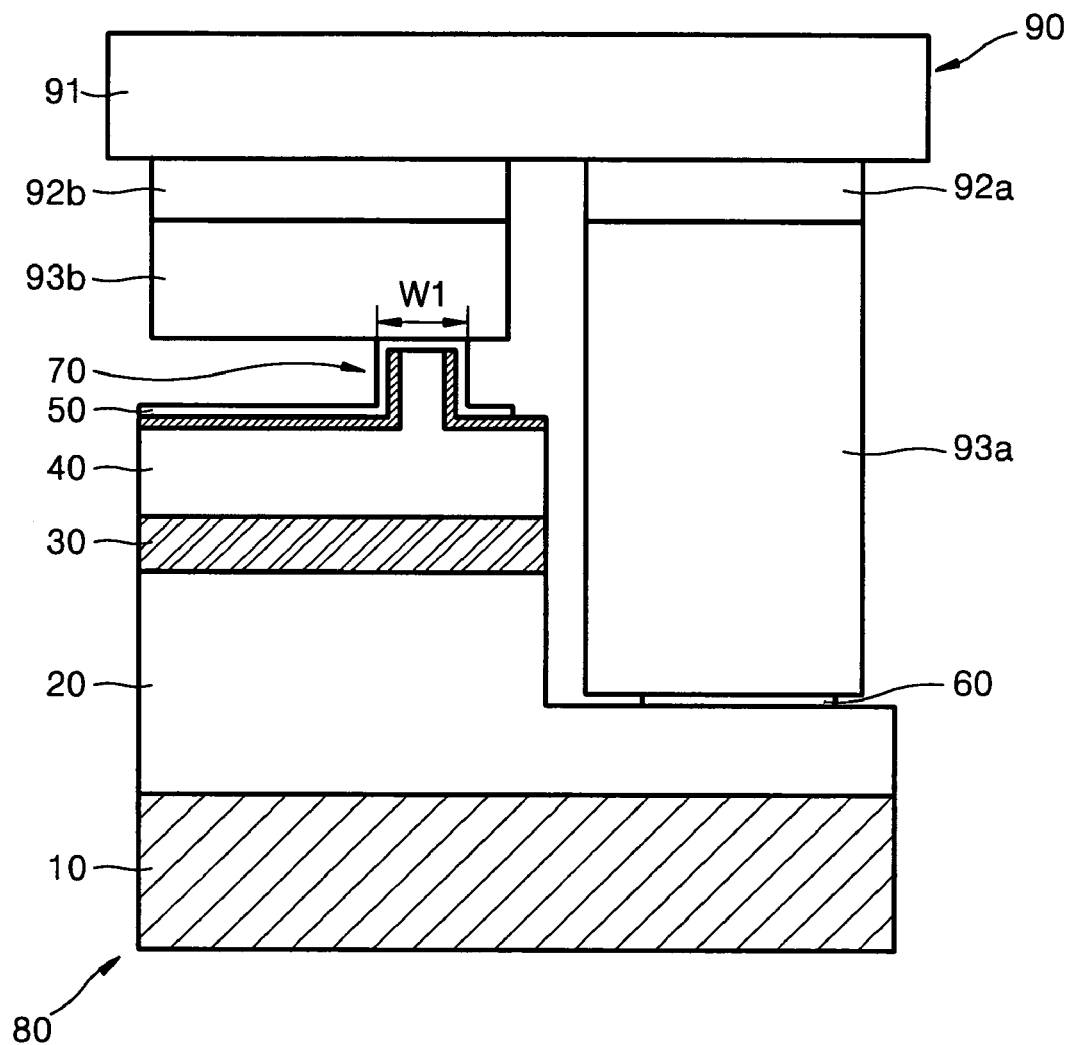
FIG. 2 is a sectional view of an example of a conventional semiconductor laser diode assembly with a flip-chip bonded structure of a submount and the semiconductor laser diode shown in FIG. 1.

Referring to FIG. 7, the submount 420 comprises a substrate 421, first and second metal layers 422a and 422b, and first and second solder layers 423a and 423b. The submount 420 differs from the submount 410 shown in FIG. 5 in that the n-type electrode 190b is the top layer of the second protrusion 220 and the first and second solder layers 423a and 423b have the same thickness due to the same height of the first and second protrusions 210 and 220. Here, it is preferable to set the thickness of the first and second solder layers 423a and 423b to be the same. Unlike the submount 90 shown in FIG. 2, the first and second solder layers 423a and 423b can be formed in a single process, and thus, can have almost the same chemical composition ratios.

Because of this structural advantage, when the semiconductor laser diode 100b is bonded to the submount 420, a thermal stress can be dispersed to the first protrusion 210 with a width wider than the ridge waveguide 200. In addition, because the first and second solder layers 413a and 423b have almost the same thickness, uneven melting of the first and second solder layers 423a and 423b is less likely to occur. Therefore, a mechanical stress to be applied to the ridge waveguide 200 can be significantly reduced. Furthermore, because the first and second protrusions 210 and 220 with a width wider than the ridge waveguide 200 support the submount 420, more stable flip-chip bonding is possible.

Figure 8:
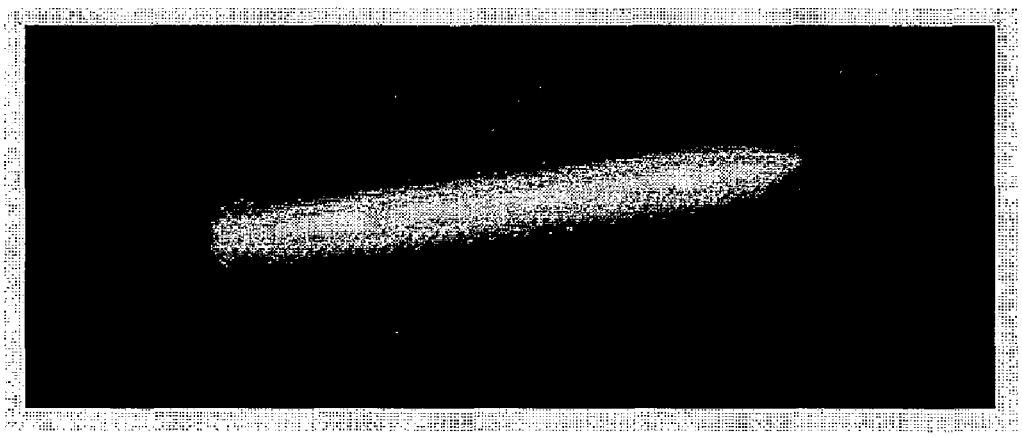
FIG. 8 is an image plane photograph of laser light emission in the semiconductor laser diode assembly shown in FIG. 7.

FIG. 8 is an image plane photograph of laser light emission in the semiconductor laser diode assembly shown in FIG. 7. It can be seen from FIG. 8 that uniform and continuous light emission occurs along the ridge waveguide, unlike in FIG. 3.

Figure 9:
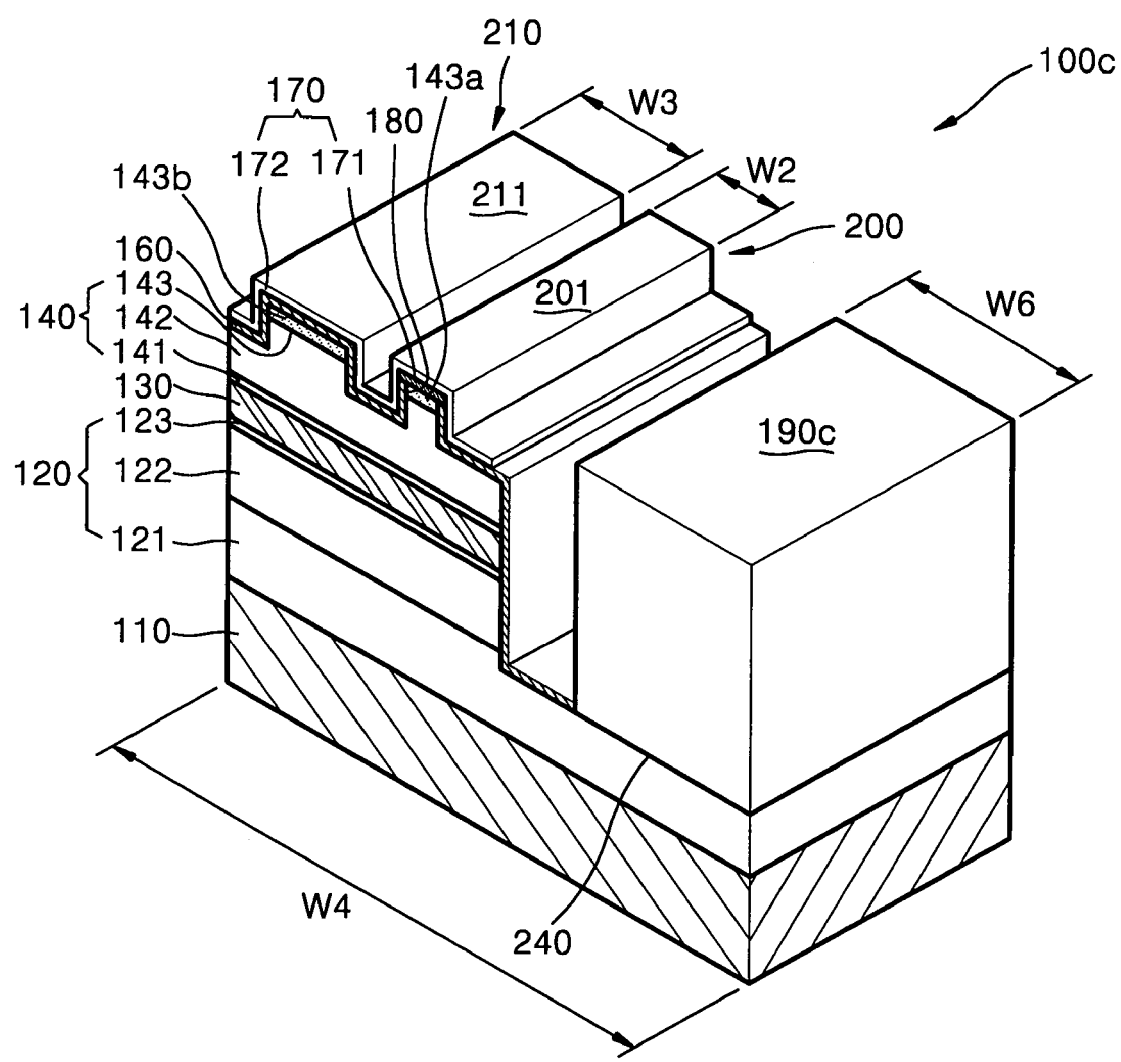
FIG. 9 is a perspective view of a semiconductor laser diode according to another embodiment of the present invention.

FIG. 9 is a perspective view of a semiconductor laser diode according to another embodiment of the present invention. The same reference numerals as used in FIGS. 4 through 7 indicate the same constitutional elements.

The semiconductor laser diode 100c differs from the semiconductor laser diode 100b shown in FIG. 6 in that an n-type electrode layer 190c serves as the second protrusion 220.

Referring to FIG. 9, an exposed surface 240 of the buffer layer 121 is formed at the other side of the ridge waveguide 200, that is, at the opposite side of the first protrusion 210 and the n-type electrode layer 190c is mounted on the exposed surface 240. Preferably, the n-type electrode layer 190c has not less height than the ridge waveguide 200. Preferably, the width W6 of the n-type electrode layer 190c is wider than that W2 of the ridge waveguide 200. Preferably, the n-type electrode layer 190c has the same height as the first protrusion 210.

Consequently, the n-type electrode layer 190c serves as the second protrusion 220 of FIG. 6. Therefore, the structural advantages obtained by using the n-type electrode layer 190c are as described with reference to FIGS. 6 and 7.

As apparent from the above description, a semiconductor laser diode and a semiconductor laser diode assembly of the present invention provide the following advantages.

A thermal stress generated upon flip-chip bonding can be dispersed to the first protrusion adjacent to the ridge waveguide. In addition, the semiconductor laser diode further comprises the second protrusion, and thus, a mechanical stress generated by time difference melting of the solder layers of the submount can be effectively dispersed. Therefore, a laser diode and its assembly with uniform light emission throughout the ridge waveguide can be provided.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor laser diode comprising first and second material layers which are multi-material layers, and an active layer interposed between the first and second material layers to emit light wherein the first material layer has a surface exposed on a same side as said active and second material layers are formed, such that a step height exists between said surface of the first material layer and a top surface of the second material layer, characterized in that the semiconductor laser diode comprises:
   a ridge waveguide formed on a portion of the second material layer having a ridge shape such that a top material layer of the second material layer is selectively exposed to define a channel, and in which a first electrode layer which is in contact with the top material layer of the second material layer via the channel is formed; and
   a first protrusion, which is positioned at one side of the ridge waveguide and has a height not less than that of the ridge waveguide,
   wherein the first protrusion has a width wider than the width of the ridge waveguide.

2. The semiconductor laser diode according to claim 1, further comprising a second protrusion having not less height than that of the ridge waveguide at the other side of the ridge waveguide.

3. A semiconductor laser diode comprising first and second material layers which are multi-material layers, and an active layer interposed between the first and second material layers to emit light, characterized in that the semiconductor laser diode comprises:
   a ridge waveguide formed on a portion of the second material layer having a ridge shape such that a top material layer of the second material layer is selectively exposed to define a channel, and in which a first electrode layer which is in contact with the top material layer of the second material layer via the channel is formed: and
   a first protrusion, which is positioned at one side of the ridge waveguide and has a height not less than that of the ridge waveguide; and
   a second protrusion having not less height than that of the ridge waveguide at the other side of the ridge waveguide,
   wherein the second protrusion has a width wider than the width of the ridge waveguide.

4. The semiconductor laser diode according to claim 2, wherein the second protrusion has the same height as the first protrusion.

5. A semiconductor laser diode comprising first and second material layers which are multi-material layers, and an active layer interposed between the first and second material layers to emit light, characterized in that the semiconductor laser diode comprises:
   a ridge waveguide formed on a portion of the second material layer having a ridge shape such that a top material layer of the second material layer is selectively exposed to define a channel, and in which a first electrode layer which is in contact with the top material layer of the second material layer via the channel is formed; and
   a first protrusion, which is positioned at one side of the ridge waveguide and has a height not less than that of the ridge waveguide: and
   a second protrusion having not less height than that of the ridge waveguide at the other side of the ridge waveguide,
   wherein the height difference between the first and second protrusions is 0.5 µm or less.

6. A semiconductor laser diode comprising first and second material layers which are multi-material layers, and an active aver interposed between the first and second material layers to emit light, characterized in that the semiconductor laser diode comprises:
   a ridge waveguide formed on a portion of the second material layer having a ridge shape such that a top material layer of the second material layer is selectively exposed to define a channel, and in which a first electrode layer which is in contact with the top material layer of the second material layer via the channel is formed:
   a first protrusion, which is positioned at one side of the ridge waveguide and has a height not less than that of the ridge waveguide; and
   a second protrusion having not less height than that of the ridge waveguide at the other side of the ridge waveguide,
   wherein the second protrusion is separated from the ridge waveguide by a valley portion, which is etched to expose a bottom material layer of the first material layer, and a top layer of the second protrusion is a second electrode layer electrically connected to the bottom material layer of the first material layer.

7. The semiconductor laser diode according to claim 1, wherein the other side of the ridge waveguide is formed with the exposed surface of a bottom material layer of the first material layer and a second electrode layer having a height not less than that of the ridge waveguide is formed on the exposed surface.

8. The semiconductor laser diode according to claim 7, wherein the first protrusion and the second electrode layer have the same height.

9. A semiconductor laser diode comprising first and second material layers which are multi-material layers, and an active layer interposed between the first and second material layers to emit light, characterized in that the semiconductor laser diode comprises:
   a ridge waveguide formed on a portion of the second material layer having a ridge shape such that a top material aver of the second material layer is selectively exposed to define a channel, and in which a first electrode aver which is in contact with the top material layer of the second material layer via the channel is formed: and
   a first protrusion, which is positioned at one side of the ridge waveguide and has a height not less than that of the ridge waveguide,
   wherein the other side of the ridge waveguide is formed with an exposed surface of the bottom material layer of the first material layer and a second electrode layer having a height not less than that of the ridge waveguide is formed on the exposed surface, and
   wherein the height difference between the first protrusion and the second electrode layer is 0.5 µm or less.

10. The semiconductor laser diode according to claim 7, wherein the second electrode layer has a width wider than the width of the ridge waveguide.

11. A semiconductor laser diode assembly comprising a semiconductor laser diode comprising first and second material layers which are multi-material layers, and an active layer interposed between the first and second material layers to emit light; and a submount flip-chip bonded to the semiconductor laser diode, characterized in that the semiconductor laser diode comprises:
- a ridge waveguide, which is formed in a ridge shape over the second material layer to define a channel so that a top material layer of the second material layer is limitedly exposed, and in which a second electrode layer which is in contact with the top material layer of the second material layer via the channel is formed;
- a first protrusion, which is positioned at one side of the ridge waveguide and has not less height than that of the ridge waveguide; and
- a first electrode layer, which is positioned at the other side of the ridge waveguide, has not less height than that of the ridge waveguide, and electrically connected to a bottom material layer of the first material layer, and the submount comprises:
- a substrate;
- a first solder layer bonded to the first protrusion and the ridge waveguide; and
- a second solder layer bonded to the first electrode layer, the first and second solder layers being formed on the substrate and having substantially the same thickness.

12. The semiconductor laser diode assembly according to claim 11, wherein the first electrode layer has a width wider than that of the ridge waveguide.

* * * * *